(12) United States Patent
Dokumaci et al.

(10) Patent No.: US 6,806,534 B2
(45) Date of Patent: Oct. 19, 2004

(54) DAMASCENE METHOD FOR IMPROVED MOS TRANSISTOR

(75) Inventors: Omer H. Dokumaci, Wappingers Falls, NY (US); Bruce B. Doris, Brewster, NY (US); Oleg Gluschenkov, Wappingers Falls, NY (US); Jack A. Mandelman, Flat Rock, NC (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 10/342,423

(22) Filed: Jan. 14, 2003

(65) Prior Publication Data

US 2004/0135212 A1 Jul. 15, 2004

(51) Int. Cl.[7] .......................... H01L 29/76; H01L 29/94
(52) U.S. Cl. ...................... 257/330; 257/331; 438/268; 438/270; 438/299; 438/303
(58) Field of Search ................................ 438/268, 270, 438/273, 274, 299, 303, 595; 257/327, 330, 331

(56) References Cited

U.S. PATENT DOCUMENTS

| | | |
|---|---|---|
| 5,182,225 A | 1/1993 | Matthews |
| 6,040,214 A | 3/2000 | Boyd et al. |
| 6,054,355 A | 4/2000 | Inumiya et al. |
| 6,143,635 A | 11/2000 | Boyd et al. |
| 2002/0192911 A1 * | 12/2002 | Parke ........................ 438/270 |
| 2002/0197810 A1 * | 12/2002 | Hanafi et al. ............... 438/330 |

FOREIGN PATENT DOCUMENTS

JP   11233646 A   8/1999

OTHER PUBLICATIONS

"Novel Gate Process for 0.1 Micron MOSFETs", IBM Technical Disclosure Bulletin, vol. 36, No. 11, Nov. 1993, pp. 455–457.

"Vertical Source/Drain Contacts for SOI Based MOSFETs", IBM Technical Disclosure Bulletin, vol. 35, No. 2, Jul. 1992, pp. 468–469.

* cited by examiner

*Primary Examiner*—Hsien Ming Lee
(74) *Attorney, Agent, or Firm*—Scully, Scott, Murphy & Pressner; Joseph P. Abate, Esq.

(57) ABSTRACT

A MOSFET fabrication methodology and device structure, exhibiting improved gate activation characteristics. The gate doping that may be introduced while the source drain regions are protected by a damascene mandrel to allow for a very high doping in the gate conductors, without excessively forming deep source/drain diffusions. The high gate conductor doping minimizes the effects of electrical depletion of carriers in the gate conductor. The MOSFET fabrication methodology and device structure further results in a device having a lower gate conductor width less than the minimum lithographic minimum image, and a wider upper gate conductor portion width which may be greater than the minimum lithographic image. Since the effective channel length of the MOSFET is defined by the length of the lower gate portion, and the line resistance is determined by the width of the upper gate portion, both short channel performance and low gate resistance are satisfied simultaneously.

18 Claims, 9 Drawing Sheets

DAMASCENE METHOD FOR IMPROVED MOS TRANSISTOR

BACKGROUND OF THE INVENTION

1. Field of the Invention

The present invention relates to semiconductor devices and methods of manufacture, and more particularly to a method for manufacturing an improved metal oxide semiconductor (MOS) transistor.

2. Description of the Prior Art

Field effect transistors (FETs) are the basic building block of today's integrated circuit. Such transistors can be formed in conventional substrates (such as silicon) or in silicon-on-insulator (SOP) substrates.

State of the art MOS transistors are fabricated by depositing a gate stack material over a gate dielectric and a substrate. Generally, the MOS transistor fabrication process implements lithography and etching processes to define the conductive, e.g., poly-Si, Si, gate structures. The gate structure and substrate are thermally oxidized, and, after this, source/drain extensions are formed by implantation. Sometimes the implant is performed using a spacer to create a specific distance between the gate and the implanted junction. In some instances, such as in the manufacture of an NFET device, the source/drain extensions for the NFET device are implanted with no spacer. For a PFET device, the source/drain extensions are typically implanted with a spacer present. A thicker spacer is typically formed after the source/drain extensions have been implanted. The deep source/drain implants are then performed with the thick spacer present. High temperature anneals are performed to activate the junctions after which the source/drain and top portion of the gate are silicided. Silicide formation typically requires that a refractory metal be deposited on the silicon wafer followed by a high temperature thermal anneal process to produce the silicide material.

In order to be able to make integrated circuits (ICs), such as memory, logic, and other devices, of higher integration density than currently feasible, one has to find a way to further downscale the dimensions of field effect transistors (FETs), such as metal oxide semiconductors. The downscaling of transistor dimensions allows for improved performance as well as compactness, but such downscaling has some device degrading effects. Generational improvements for high performance MOS devices are obtained by decreasing the transistor line width (L poly), reducing the gate oxide thickness, and decreasing the source/drain extension resistance. Smaller L poly results in less distance between source and drain. This results in faster switching speeds for complementary metal oxide semiconductor (CMOS) circuits. However, as the L poly gets smaller, the overall area available for silicidation is reduced. This means that as L poly shrinks, line resistance is increased. Increased line resistance causes degradation in device performance.

Drive currents for MOS devices are inversely proportional to gate dielectric thickness. Thinner gate oxides yield higher drive currents. One problem with this, however, is that as the gate oxide is thinned, poly depletion effects become more pronounced. Poly depletion is an effective thickening of the gate oxide. One prior art method to overcome this problem is gate predoping, In this prior art technique, the blanket poly-Si is implanted prior to gate patterning. The problem with the predoping method is that the gate profiles and etching are difficult to control.

Source/drain extension resistance is another important performance factor. Drive currents may be increased by reducing source/drain extension resistance. Increasing the source/drain extension dose leads to lower resistance but has an undesirable side effect of increasing the junction depth. One method for overcoming this problem is to implant the extension first with no spacer present and then form a thin spacer and perform a second implant. Alternatively, a notched gate may be used to perform this task by implanting at two or more angles. The drawback of the first method is increased process complexity; while the drawback of the second method is that notched gates typically have reduced line width control.

It would be highly desirable to provide a MOS transistor device that has sub-lithographic channel length, improved gate activation characteristics, reduced gate conductor line resistance, and reduced source/drain extension resistance.

SUMMARY OF THE INVENTION

It is an object of this invention to provide a high performance MOS transistor device having sub-lithographic channel length, improved gate activation characteristics, reduced gate conductor line resistance, and reduced source/drain extension resistance. The term "sub-lithographic channel length" denotes a channel length that is about 0.7 F. or less, more preferably from about 0.5 F. or less, wherein F is the minimum feature size. Sub-lithographic dimensions are less than the minimum dimension that can be reliably produced utilizing conventional lithography and etching techniques.

According to a preferred embodiment of the present invention, there is provided a novel damascene gate process that satisfies the above requirements. In the improved process of the present invention, lower and upper portions of the gate conductor are independently defined. The width of the lower portion of the gate conductor defines the channel length of the MOSFET and is sub-lithographic minimum width for high performance. The upper portion is wider than the lower portion, and may be greater than lithographic minimum dimension. The silicided, or self-aligned silicide (salicide), wider upper portion provides for gate conductor resistance which is lower than what is obtainable from the presently known ark providing reduced delay and dispersion of pulses propagating down a long gate conductor. It is understood that the wider upper portion may alternatively include a metallic region.

Advantageously, besides defining sub-lithographic channel length defined by a lower gate conductor portion, there is a low gate resistance, for even higher performance, due to the wider upper gate conductor portion, which may comprise a silicide or comprise a metal. It is understood that the narrow lower and upper portions are self-aligned to each other. Further, the gate conductor may further be degeneratively doped, for minimization of gate depletion effects, without compromising S/D junction doping.

A high performance MOSFET providing the above elements and advantages is provided including a substrate; a sub-lithographic channel defined in the substrate by a narrow lower gate conductor portion; a wider upper gate conductor portion self-aligned with the narrow lower gate conductor portion; and source and drain diffusion regions formed on either side of the channel. The above described MOSFET device exhibits low gate line resistance and enhanced sub-lithographic channel length performance.

In broad terms, the inventive structure is prepared using a method which comprises:

a) providing a structure of one or more pad layers to function as a mandrel over a semiconductor substrate, said one or more pad layers having an aperture;

b) depositing a dielectric material within said aperture;

c) forming respective spacer elements on either sidewall of said aperture overlying said dielectric material in said aperture;

d) removing a portion of said dielectric material not underlying said spacer elements within said aperture to define a region of sub-lithographic width;

e) depositing a gate dielectric in said region, wherein said gate dielectric is positioned between a remaining portion of said dielectric material;

f) depositing a first gate conductor material in said region to form a sub-lithographic lower gate conducting portion within said aperture;

g) depositing a second gate conductor material to form an upper gate conducting portion within said aperture having a dimension that is wider than said sub-lithographic lower gate conducting portion, and self-aligned to said sub-lithographic lower gate conductor portion;

wherein a resulting MOSFET device includes a sub-lithographic channel length according to said sub-lithographic lower gate conducting portion.

More specifically, the above inventive structure may be produced using a method which includes at least the steps of: providing a pad dielectric layer to function as a mandrel layer over a semiconductor substrate; forming an aperture defining a gate region for a MOSFET device in the mandrel layer; depositing a dielectric material above the mandrel layer and in the aperture bordering the mandrel layer, forming respective spacer elements on either sidewall of the aperture overlying the dielectric material in the aperture; removing a portion of the dielectric material in the aperture not lying underneath the spacers to define a sub-lithographic image width, depositing a gate dielectric in the aperture at the sub-lithographic image width; forming a lower gate conducting portion between the remaining dielectric material in the aperture; removing the spacer elements; forming an upper gate conducting portion between the mandrel layer in an upper portion of the aperture, the upper portion being wider than the lower portion and self-aligned with said lower gate conducting portion; wherein the resulting MOSFET device includes a sub-lithographic channel defined by a narrow lower portion of a lower gate conducting portion and, exhibits the lower gate resistance due to the wider upper gate conducting portion.

BRIEF DESCRIPTION OF THE DRAWINGS

The objects, features and advantages of the present invention will become apparent to one skilled in the art, in view of the following detailed description taken in combination with the attached drawings, in which.

Figure 1:
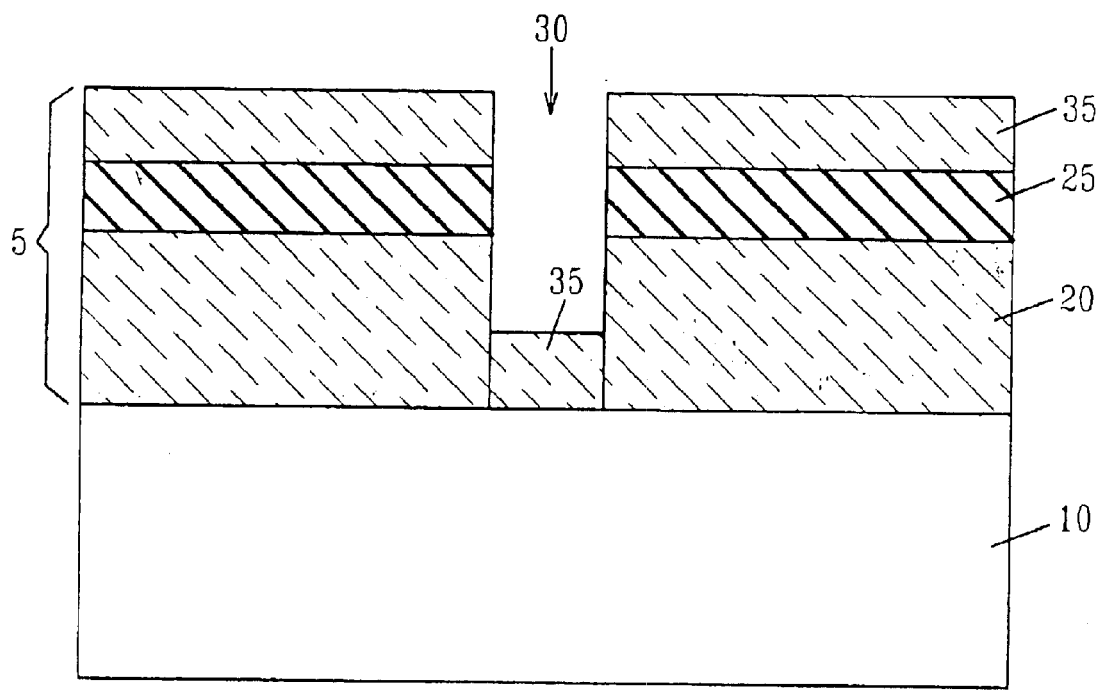
FIG. 1 illustrates the result of initial processing steps including the formation of an aperture in a pad stack to define a device gate structure according to the method of the invention.

A process sequence for this invention is as follows:

DETAILED DESCRIPTION OF THE PREFERRED EMBODIMENTS

The present invention, which provides a method of forming an improved CMOS device having a sub-lithographic gate conductor, lower gate line resistance and minimal gate depletion effects will now be described in more detail. It is noted that in the accompanying drawings, like and/or corresponding elements are referred to by like reference numerals.

FIG. 1 illustrates the result of initial processes steps including the formation of an aperture 30 in a pad stack 5 that defines a device gate structure according to the method of the invention. In the first steps of the process illustrated in FIG. 1, a pad stack 5 comprising a relatively thick dielectric, e.g., pad oxide layer 20, formed above a substrate 10, e.g., silicon substrate, and a thick pad dielectric 25, e.g., silicon nitride (SiN) layer, formed above the pad oxide layer 20 to provide the active and isolation regions is fabricated according to conventional techniques. Substrate 10 may include various structures such as implantation wells, surface threshold adjustment implants, silicon- or silicon germanium-on-insulator layered structures, strained layers and islands, isolation structures (e.g., trench isolation) and memory cells. These structures are not shown in the drawings, but nevertheless meant to be included into the substrate 10.

As shown in FIG. 1, the thick pad dielectric 25 provides a mandrel for the damascene gate, and, although not shown, a thin nitride layer etch stop is provided under the thick pad oxide 20 to protect the STI during subsequent removal of the thick pad oxide 20 (functioning as a damascene mandrel). The thin nitride etch stop layer may have a thickness ranging from about 2 nm to about 10 nm. A further step includes the etching (e.g., reactive-ion etching (RIE)) of an aperture 30 in the pad stack 5 that will include the gate structure of the improved MOS device. The width of the aperture 30 results in a gate (channel lengths) of approximately one lithographic feature size, ranging from approximately 30 nm to 100 nm, preferably 60 nm. Further, as shown in FIG. 1, the process includes the step of depositing another dielectric layer, e.g., a high-density plasma (HDP) oxide layer 35 atop the SiN thick pad dielectric 25, and in the aperture 30. The rate of HDP deposition process is substantially higher on the surfaces exposed to plasma ions. Subsequently, HDP oxide grows bottom-up in the narrow apertures. The residue of HDP oxide on the vertical walls of aperture 30 is removed in a hydrofluoric (HF)-based solution resulting in the structure shown in FIG. 1.

Figure 2:
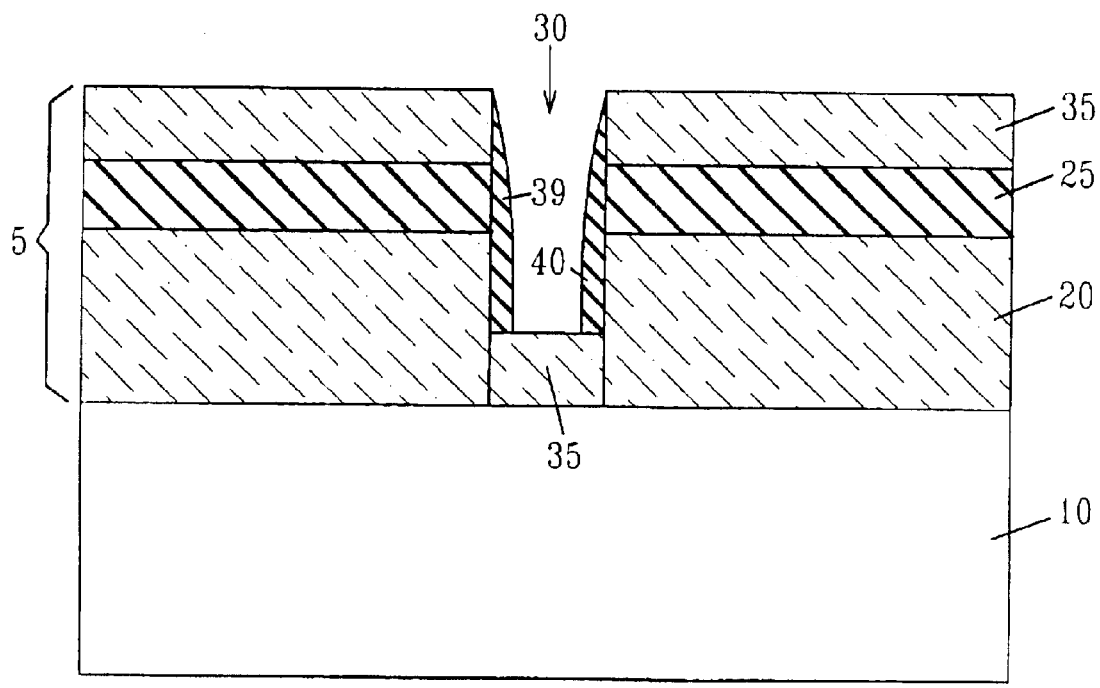
FIG. 2 illustrates the forming of nitride spacers 39, 40 in the aperture 30 in the pad stack of FIG. 1.

A next process step of the present invention includes the formation of insulative spacers 39, 40 along the sidewalls of the aperture 30, and atop a portion of the HDP oxide layer 35 positioned at the aperture's base 30, as depicted in FIG. 2. The insulative spacers 39, 40 maybe comprised of a nitride, for example, SiN, and may have a thickness ranging from about 2 to about 5 nm. As will be described with respect to FIGS. 3 through 6, these spacers 39, 40 will contribute to the subsequent etch narrowing of the HDP dielectric oxide layer 35 to enable formation of a gate dielectric and a lower gate conductor portion that is shorter than the minimum lithographic image.

Figure 3A:
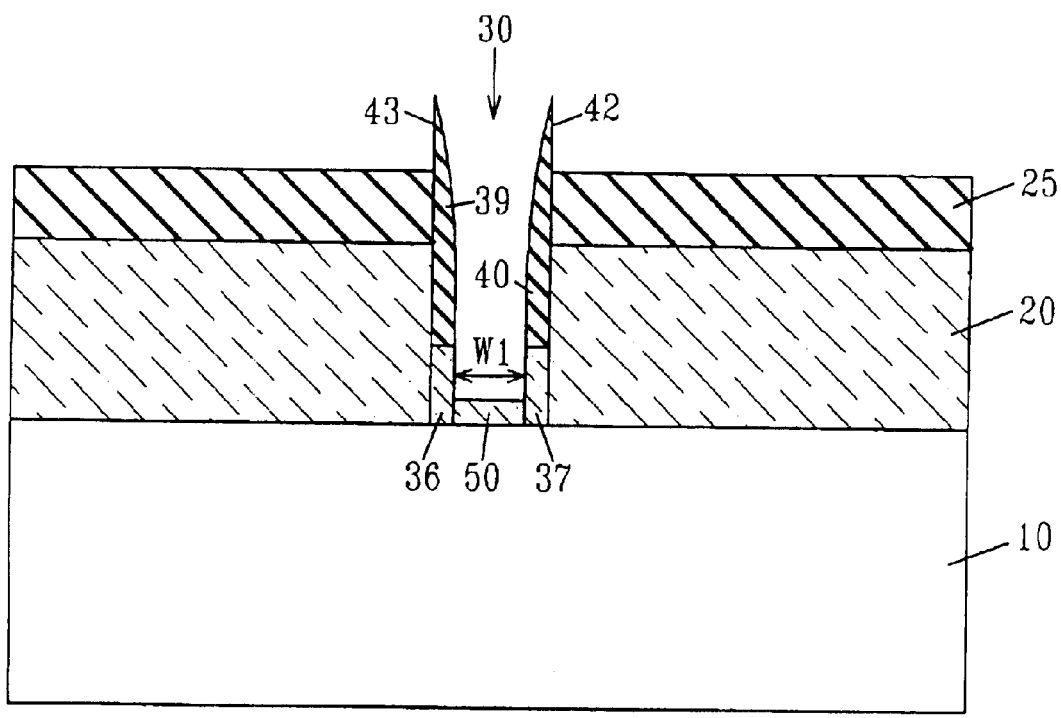
FIG. 3(a) illustrates the result of a process step for removing the exposed HDP oxide in order to form gate dielectric 50 for the MOS transistor device.

As shown in FIG. 3(a), a directional etch step, such as reactive-ion etching (RIE), is implemented to remove the exposed regions of the HDP oxide layer 35, however, thin HDP dielectric sidewall placeholders 36, 37, each of a width approximately that of the respective spacer elements 39, 40 remain, to later form a notch in the gate region. A gate dielectric 50 for the MOS transistor device is then deposited in the region between the remaining thin HD sidewall dielectric placeholders 36, 37. The width of the region, W1, is of sub-lithographic dimension. The gate dielectric is formed using conventional techniques such as chemical vapor deposition (CVD), atomic layer CVD (ALCVD), pulsed CVD, plasma or photo assisted CVD, sputtering, and chemical solution deposition, or alternatively, the gate dielectric is formed by a thermal growing process, which may include oxidation, oxynitridation, nitridation, and/or plasma or radical treatment. The dielectric material is preferably comprised of oxides and oxynitrides including metal oxides, oxynitrides, and silicates known as high-k materials and certain nonconductive nitrides such as silicon and aluminum nitride or combinations and multilayers thereof. The gate dielectric material can be in either amorphous, polycrystalline, or epitaxial form. A gate preclean step may optionally be performed prior to forming gate dielectric 50. The optional preclean step can include the step of removing of the etch-stop layer. The gate dielectric 50 has a thickness of from about 1 to about 3.5 nm and a width of sub-lithographic dimension, W1.

Figure 3B:
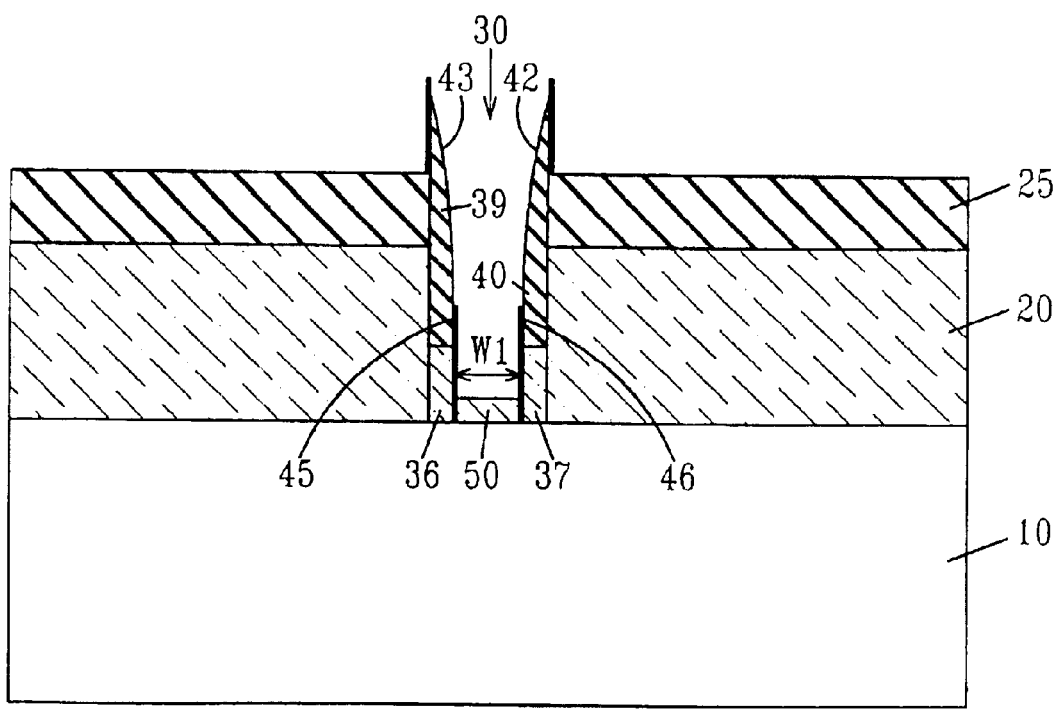
FIG. 3(b) illustrates the result of a process step for removing the exposed high density plasma (HDP) oxide in order to form gate dielectric 50 for the MOS transistor device when second insulating spacers 45, 46 are utilized.

Optionally, following RIE and prior to gate dielectric 50 deposition, a second set of insulating spacers may be formed. Following the removal of the exposed layers of HDP oxide 35, a second set of nitride spacers 45, 46 are formed within the aperture 30. Particularly, an insulating dielectric sidewall layer on the order of about 2.0 to about 5.0 nm thick, e.g., a SiN layer, is conformally deposited and RIE'd selective to the HDP dielectric (oxide) to form thin insulating second spacer elements 45, 46 which protect corresponding HDP dielectric notch sidewall placeholders 36, 37. In addition to SiN, the spacer material may be comprised of other nitrides, oxynitrides, or combinations thereof. Following the formation of the optional insulating second spacer elements 45, 46, the gate dielectric 50 is formed as depicted in FIG. 3(b).

Figure 4A:
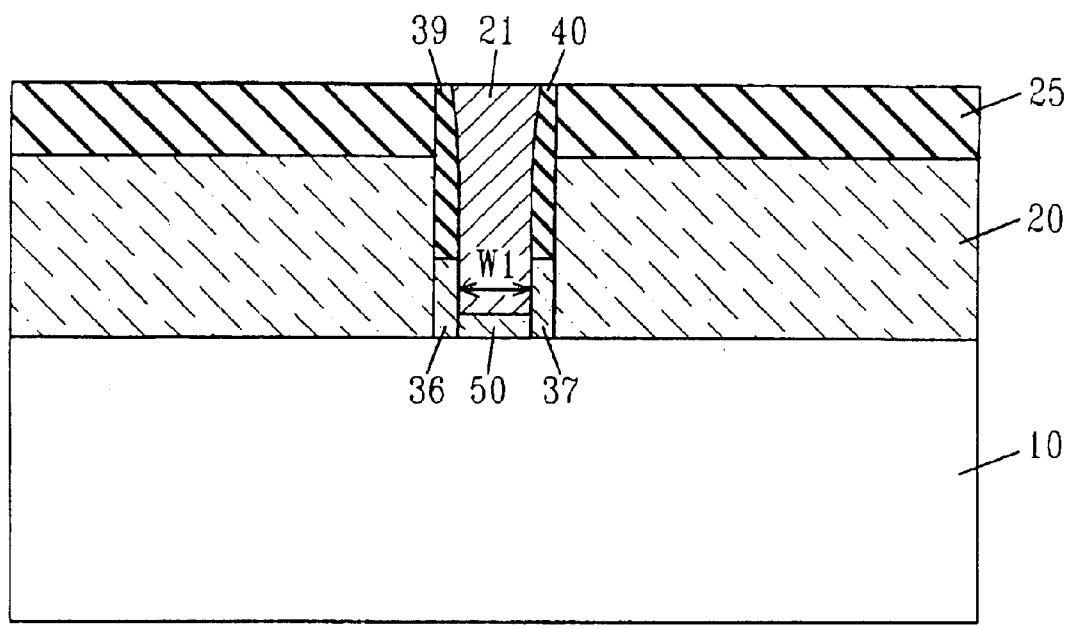
FIGS. 4(a) and (b) illustrate the structure resulting from the step of depositing gate conductor material in the aperture 30 and a subsequent top surface planarizing step.
Figure 4B:
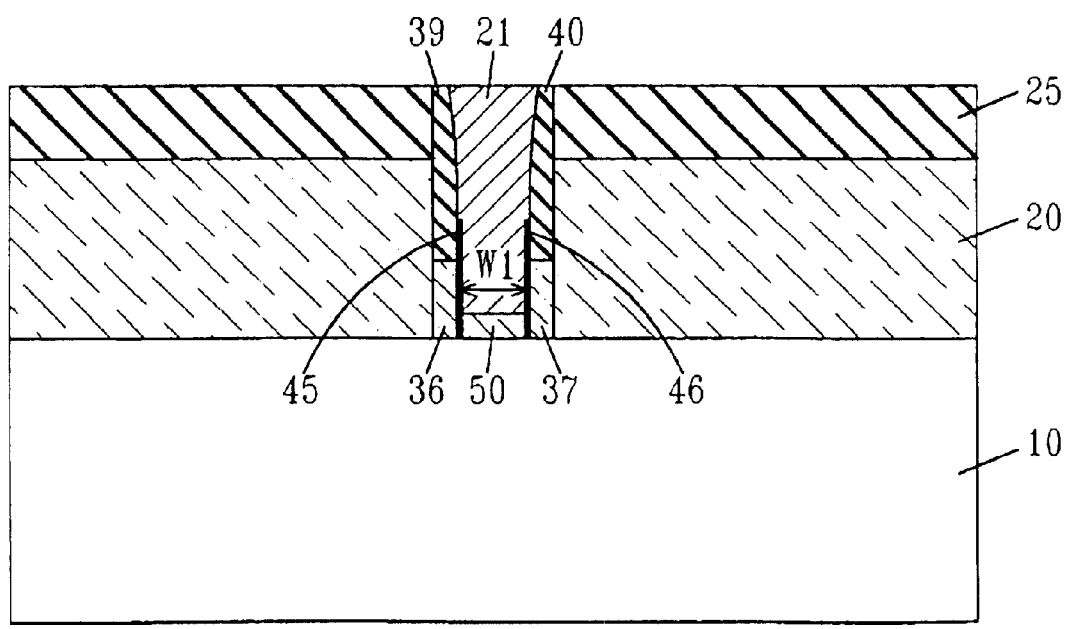

Continuing with the process, a next step is to remove the "ears" 42,43 resulting from the formation of the nitride spacers 39,40 that extend outward from the surface of the SiN thick pad dielectric 25, after removal of the HDP oxide layer 35. Following removal of the ear structures 42,43, a first gate conductor material 21 is deposited into aperture 30 and the structure is planarized to the top surface of the SiN thick pad dielectric 25, as shown in FIG. 4(a). First gate conductor material 21 is preferably polysilicon but may also be comprised of Ge, SiGe, SiGeC, metal suicides, metallic nitrides, metals (for example W, Ir, Re, Ru, Ti, Ta, Hf, Mo, Nb, Ni, Al) or other conductive materials. FIG. 4(b) represents this process step when utilizing optional insulating second spacer elements 45, 46.

It should be understood that an optional step of providing a gate implant using a heavy ion dose into the exposed gate conductor may be performed at this point. An advantage of performing a very heavy gate implant at this time is to maximize the gate conductor doping without affecting the source/drain regions. This results in improved activation of dopant in the gate conductor, and minimizes electrical depletion of carriers in the gate conductor. A typical heavy gate implant dose is from about 1 E15 cm$^{-2}$ to about 5E16 cm$^{-2}$. The implant energy is kept substantially low to prevent penetration of implanted material in the substrate. A thin screen dielectric (typically a silicon oxide film of 10–100 Å in thickness) can be grown on the gate conductor surface prior to the gate implantation. If the screen dielectric is present, the implant energy should be substantially large to allow for ion penetration into the gate conductor. A typical implant energy range is from about 1 to about 20 keV. An optional anneal can be conducted after the implantation to redistribute the ions within the gate conductor. An optional block-mask can be used prior to implantation to preselect the substrate area for gate conductor doping with one dopant type. The block-mask application and implantation procedure can be repeated to doped selected gate conductors with different dopant types. Typically, the p-type gate conductor is doped with boron while the n-type gate conductor is doped with phosphorus.

Figure 5A:
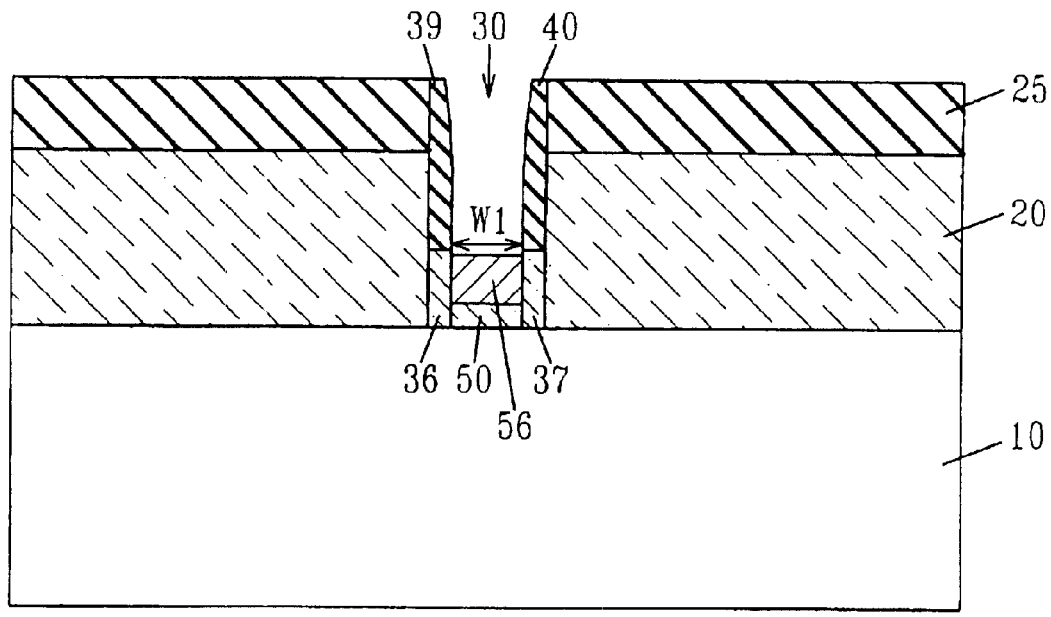
FIGS. 5(a) and (b) illustrate the structure resulting from the step of recessing the gate poly to a level approximately at, or near the bottom of the spacers, to leave a lower gate conductor portion 56.
Figure 5B:
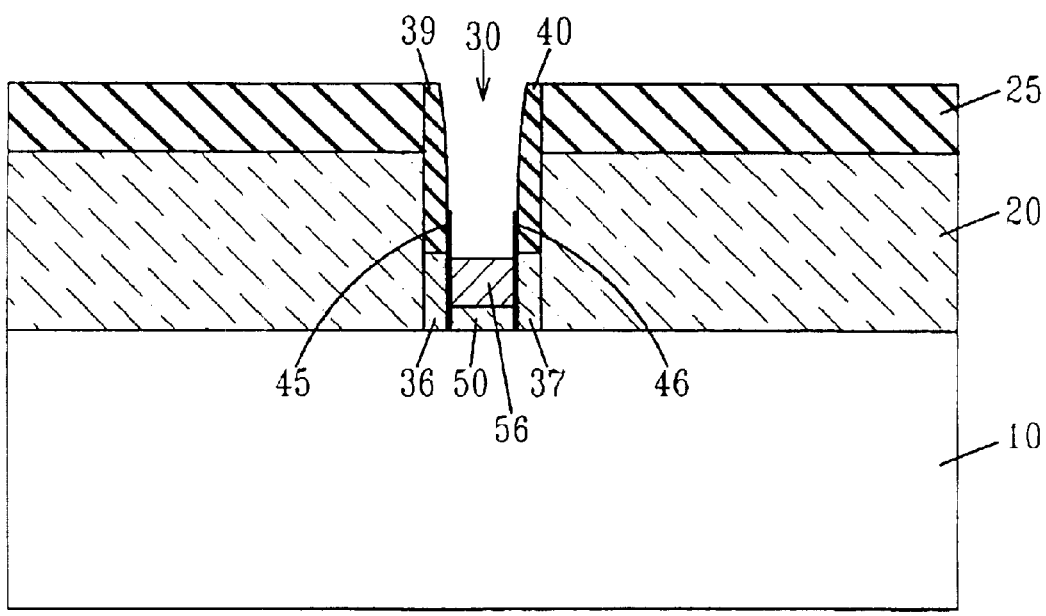
Figure 6:
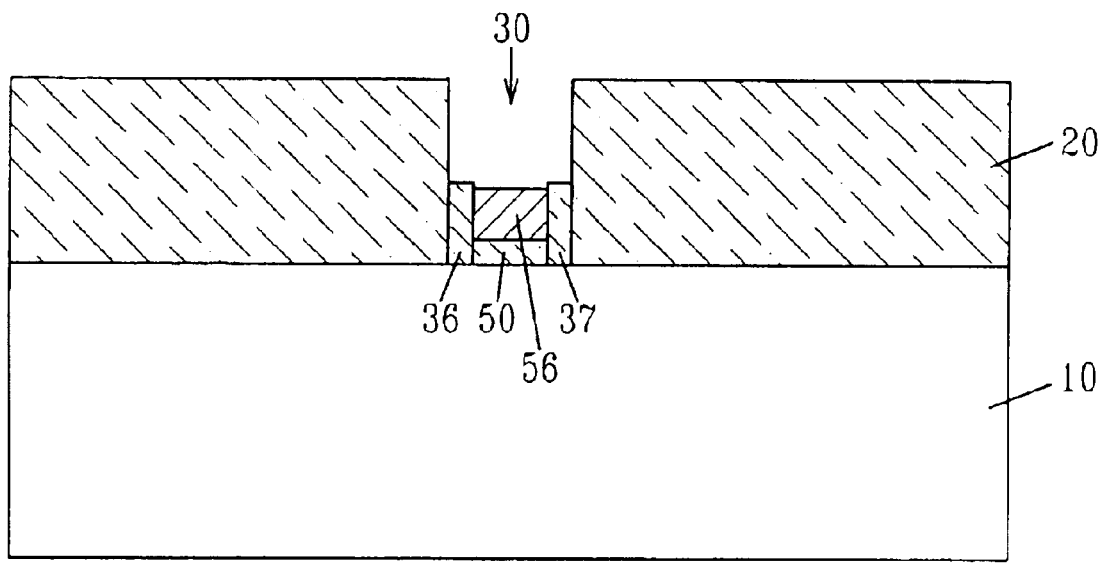
FIG. 6 illustrates the structure resulting from steps of removing the pad nitride 25 and nitride spacers 39, 40.

Referring to FIG. 5(a), the deposited first gate conductor 21 is recessed using conventional etching techniques, timed to recess first gate conductor 21 to an approximate level at or near the bottom of the HDP sidewall dielectric placeholders 36, 37, as shown in FIG. 5(a) to form a lower gate conductor portion 56. Lower gate conductor portion 56 is formed atop the gate dielectric 50 and has a width of sub-lithographic dimension W1. This etching step may be carried out utilizing polysilicon etch gas chemistries such as, for example, fluorine-based gases, including $CF_4$, $CF_4/O_2$, $SF_6$, and $C_2F_6/O_2$, but also may include polysilicon plasma etch gasses that contain both chlorine and fluorine. FIG. 5(b) represents this process step when utilizing optional insulating second spacer elements 45, 46.

It should be understood that an optional step of providing a gate implant into the exposed gate conductor may be also performed at this point. The implant may be of the same or different type as the gate implants eluded above. Because the gate conductor is recessed, the implant energy and implant type are selected to minimize implant tail in the substrate. For instance, an extremely low energy plasma doping technique can be used in this step to minimize dopant penetration into the substrate 10. Alternatively, only ions with shorter implantation range per given implant energy can be implanted at this point. For instance, more heavy ions (e.g. phosphorus) are more preferable at this step than the lighter ions such as boron.

Then, the SiN thick pad dielectric layer 25 and the spacer elements 39, 40 are removed using conventional selective etching techniques resulting in the formation illustrated in FIG. 6(a). Conventional etching techniques may include but are not limited to: RIE, anisotropic etching, isotropic etching and wet etching. FIG. 6(b) represents this process step when utilizing optional insulating second spacer elements 45, 46.

Figure 7A:
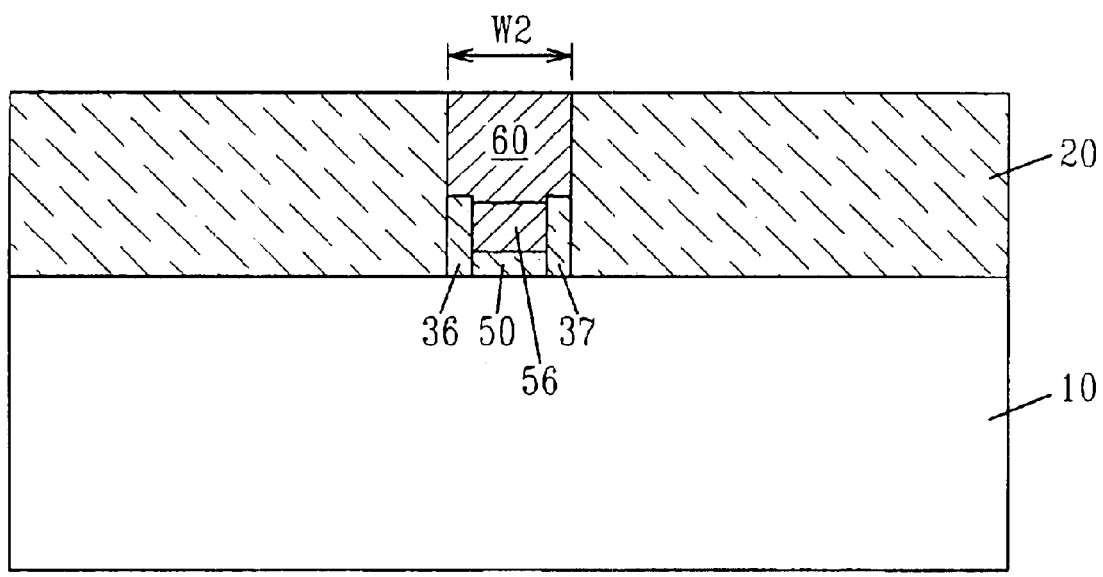
FIGS. 7(a) and (b) illustrate the structure resulting from steps of depositing a second gate conductor material in the aperture to form an upper portion of the gate conductor 60 and, planarizing the top surface.
Figure 7B:
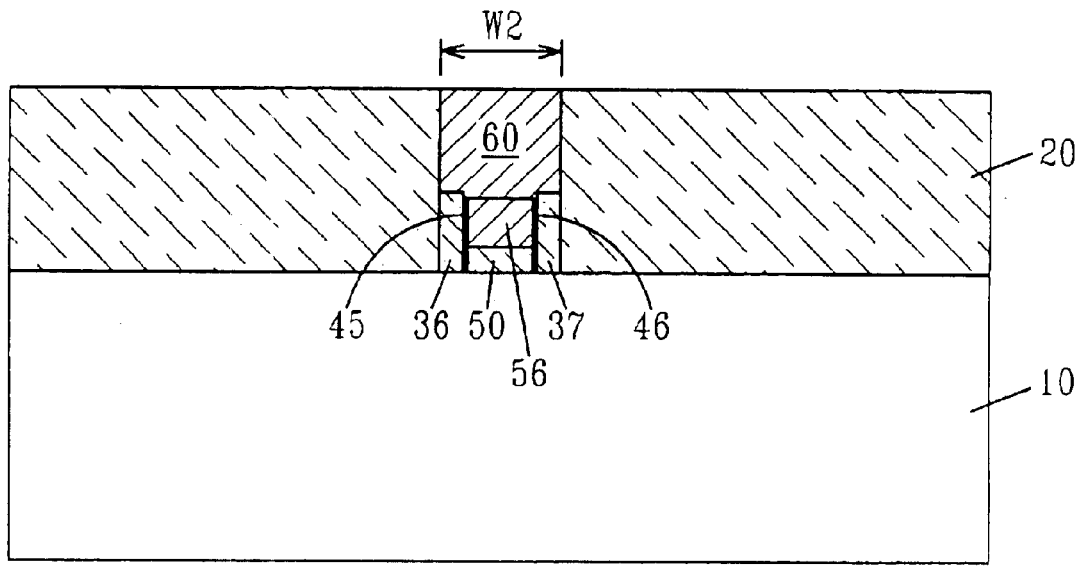
FIG. 7(c) illustrates the structure resulting from steps of recessing the exposed gate and thereafter conformally depositing and polishing a dielectric layer to form an insulating cap 57 over the gate conductor.

Next, as shown in FIG. 7(a), a second gate conductor layer is deposited in the aperture to form an upper portion 60 of the gate conductor and, a planarizing step is performed. The second gate conductor is preferably polysilicon, but a metal, silicide, metallic nitride, or other conductive material may be alternately used for producing the upper portion of gate conductor 60. A conductive diffusion barrier can be disposed in between layers 56 and 60 to prevent material intermixing and interdiffusion in subsequent high temperature steps. For example, tungsten, tungsten silicide, tungsten nitride, or other refractory and transitional metals (or suicides or nitrides thereof) or combinations thereof may be utilized to form the upper gate conductor portion 60 having a reduced resistance. Whatever gate conducting material is used to form the upper gate conductor portion 60, it is understood that this upper portion of the gate structure is of a width commensurate with the aperture 30 width W2 and may be greater than the minimum lithographic image. It should be understood that an optional step of providing a gate implant into the exposed gate conductor may be also performed at this point. The implant may be of the same or different type as the gate implants eluded above. If there is a diffusion barrier between the lower gate conductor 56 and the upper layer 60, the implant energy should be substantially large to place the majority of implanted ions to below the diffusion barrier. This may cause a large gate implant tail in the substrate. Therefore, in the presence of the diffusion barrier, it is preferable to implant the lower conductor 56 in the prior step(s). However, if the dopants can freely diffuse from layer 60 into the layer 56 the gate implantation is preferable at this step. FIG. 7(b) represents this process step when utilizing optional insulating second spacer elements 45, 46.

Figure 7C:
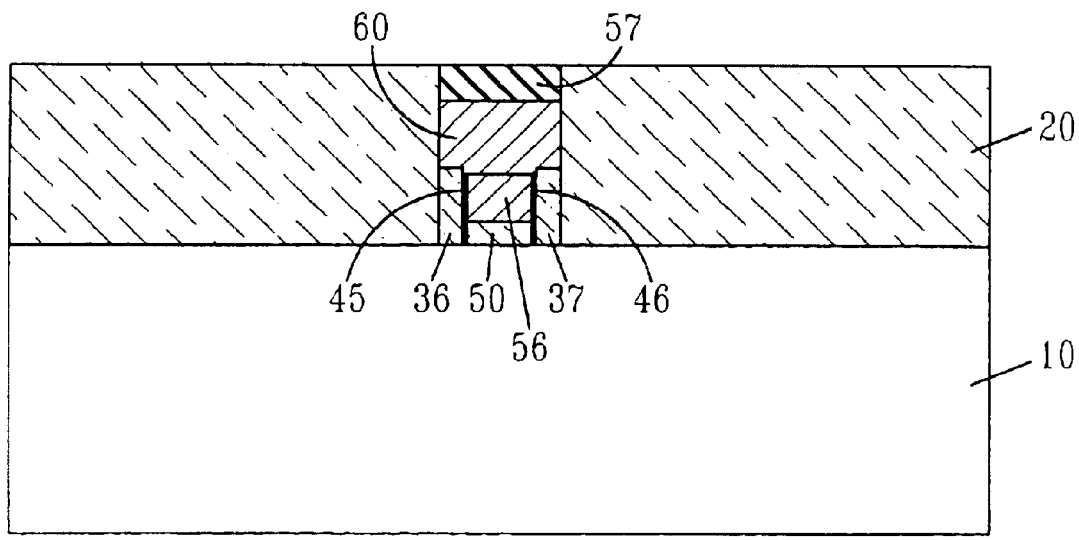

Following an optional gate implant, the top surface of the exposed gate may be recessed. To recess the top surface of the upper gate conductor portion 60 a timed etch selective to conductor material is utilized. Thereafter, a further dielectric layer, e.g., a SiN layer, may be conformally deposited and polished to form an insulating cap 57 over the upper portion of the gate conductor 60 as shown in FIG. 7(c). The insulating cap 57 is required if it is later desired to form diffusion contact studs which are borderless to the gate conductor. Although depicted in FIG. 7(c) with only one set of insulating spacers 39,40, this process step may also be incorporated when second insulating spacers 45, 46 are utilized.

Figure 8A:
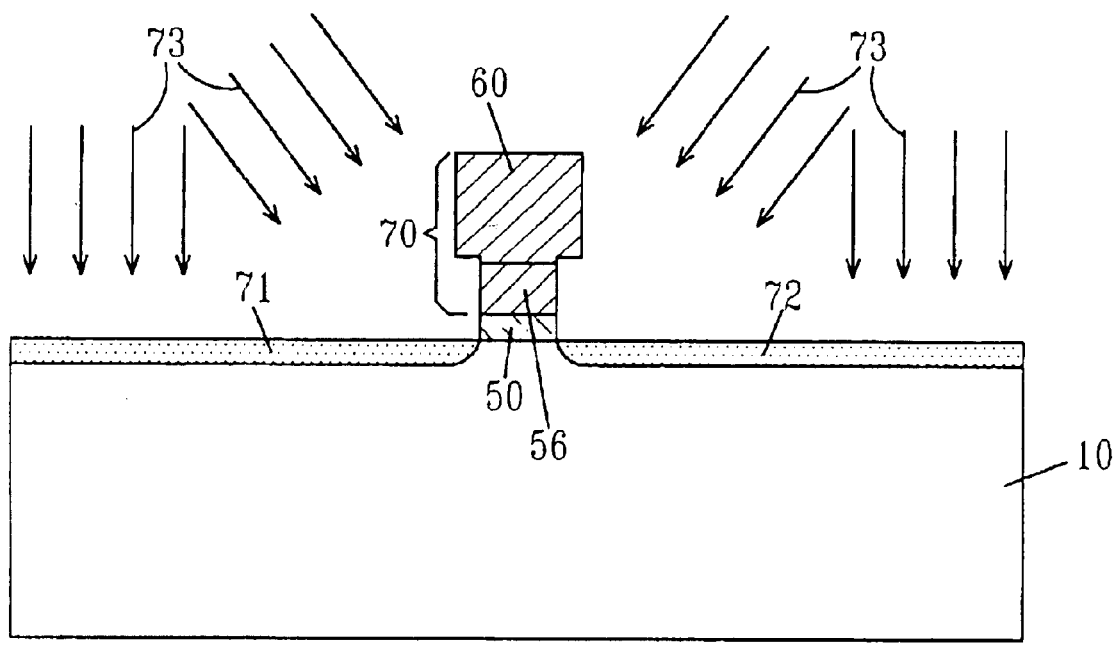
FIGS. 8(a) and (b) illustrate the structure resulting from steps of removing the pad oxide layer (damascene mandrel) 20 and remaining HDP dielectric placeholders 36, 37, thereby exposing the gate conductor.

Referring to FIG. 8(a), the pad oxide layer 20 (damascene mandrel 20) and remaining HDP dielectric placeholders 36, 37 are then removed using a combination of RIE and isotropic etching, in a manner to avoid cutting the gate dielectric 50. The anisotropic RIE etch process is first used to remove the pad oxide 20 selective to polysilicon and silicon, wherein oxide material is removed. Following RIE pad oxide removal 20, a nitride selective wet etch, in which oxide HDP sidewall dielectric placeholders 36, 37 are removed, is performed. The nitride selective wet etch is timed to avoid cutting the gate dielectric 50. Furthermore, a thin nitride etch stop barrier which had been formed between the pad oxide 20 and the substrate 10 prevents etching into the shallow trench isolation region, STI (not shown), during the pad oxide 20 and HDP oxide sidewall placeholder 36, 37 removal. Once the composite gate conductor 70 is exposed, a thin sidewall dielectric (not shown) may be optionally grown. This dielectric may include oxides, nitrides, oxynitrides, thermally stable low-k materials (such porous oxides, fluorinated oxides, carbon-based materials, boron nitride, etc.) or any combination. The sidewall dielectrics are formed by deposition of a dielectric material and etching.

Figure 8B:
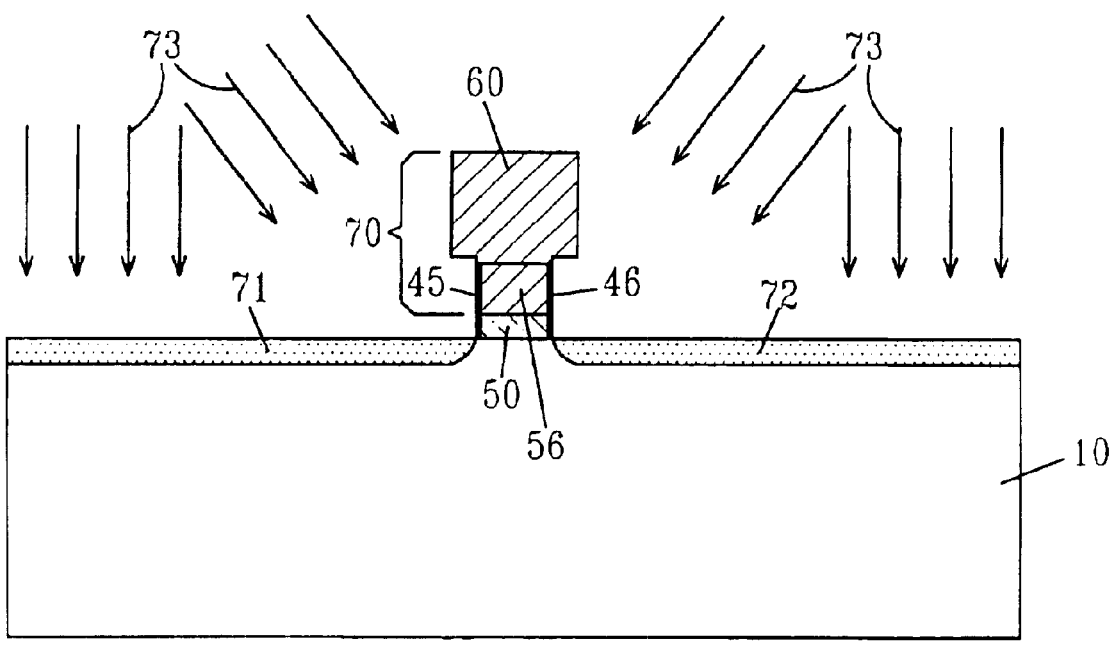
Figure 9:
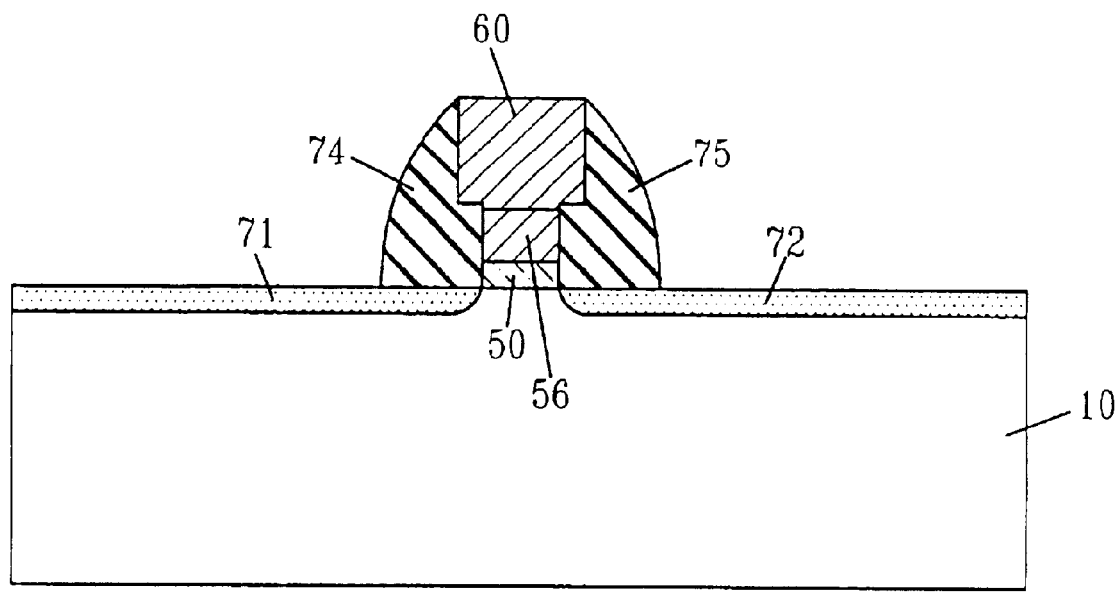
FIG. 9 illustrates the structure resulting from a step of forming thick sidewall spacers 75 using well known deposition processes.
Figure 10:
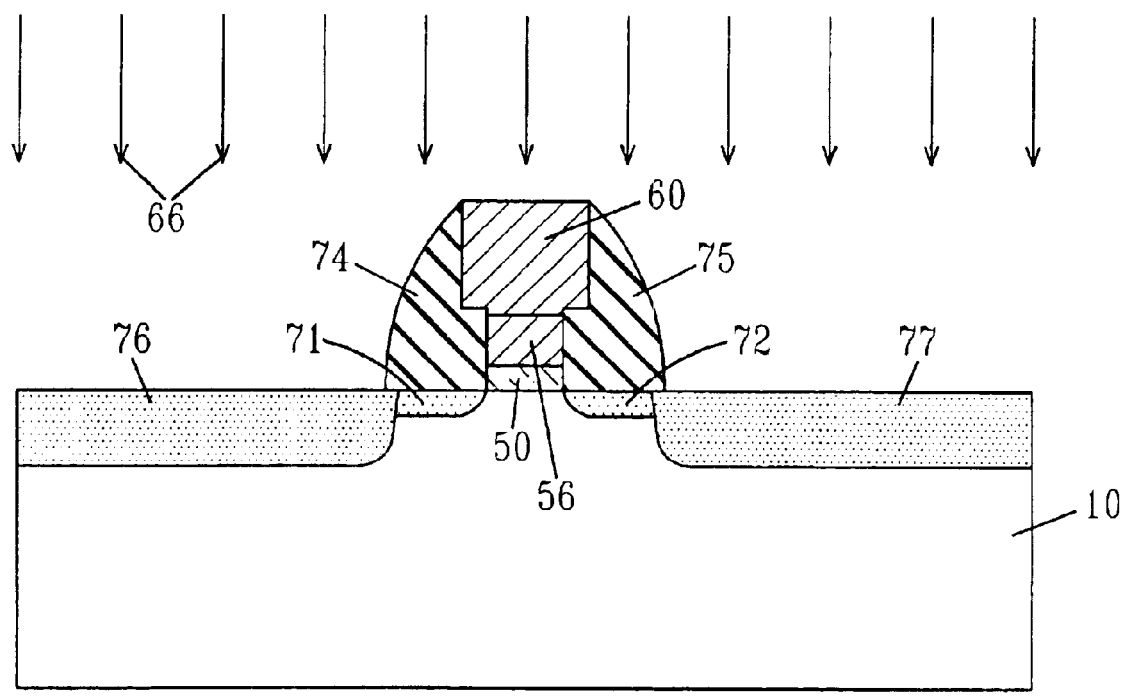
FIG. 10 illustrates the structure resulting from a step of heavily implanting dopant into respective source/drain regions 76 and 77.
Figure 11:
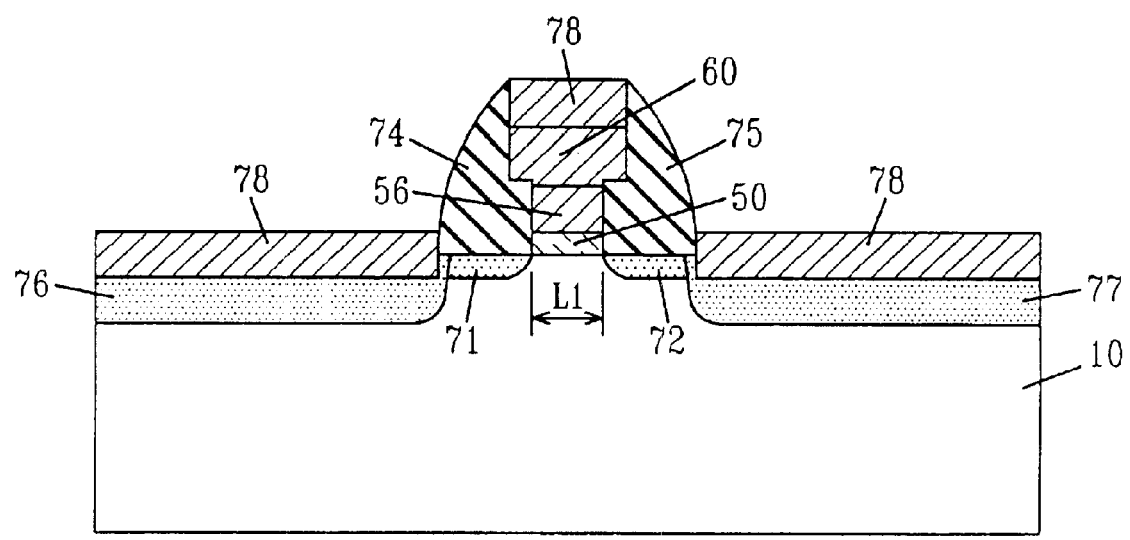
FIG. 11 illustrates the structure resulting from a step of implementing normal processing for siliciding the gate and the diffusion regions.

Referring to FIG. 8(b) the optional insulating second nitride spacers 45, 46 that had been formed following RIE of the HDP oxide layer 35 (as shown in FIG. 3(b)) protect the gate dielectric 50, e.g., gate oxide, during the oxide removal process. Furthermore, a Win nitride etch stop barrier which had been formed on the STI oxide (not shown) prevents etching into the STI during the pad oxide 20 and HDP oxide 35 removal. The process steps depicted in FIGS. 9–11 representing only one set of insulating spacers 39, 40 are equally applicable when second insulating spacers are utilized 45, 46.

A further processing step including Sightly doped drain (LDD) extension source/drain 71, 72 and/or halo implantation may then be performed. As indicated by the arrows 73 in FIGS. 8(a) and (b), the implants may be comprised of a combination of normally incident and angled implants to form the desired grading in the extensions and halos. Then, as indicated in FIG. 9, thick sidewall spacers 74, 75 are formed, using a well-known deposition process. The spacer material may comprise a dielectric such as a nitride, oxide, oxynitride, or a combination thereof. Heavily doped source/drain regions 76, 77 are then implanted, as indicated by the arrows 66 in FIG. 10, to provide low resistance for the diffusions, and to facilitate the subsequent formation of contacts. Finally, implementing normal processing, the gate and the diffusion regions are salicided as indicated by layer 78 in FIG. 11. Salicidation (self-aligned silicidation) typically requires a refractory metal be deposited on the silicon wafer followed by a high temperature thermal anneal process to produce the silicide material. The final MOSFET structure, as depicted in FIG. 11, includes a channel length L1 of sub-lithographic dimension.

The invention comprising the fabrication methodology described with respect to FIGS. 1–11 results in a MOS transistor with improved gate activation characteristics. The gate doping that may be introduced while the source drain regions are protected by the damascene mandrel, allow very high doping in the gate conductors, without having to worry about excessively doped source/drain diffusions. As a result, the source/drain regions can be placed closer to the gate thus minimizing series resistance of the extension region. The high gate conductor doping minimizes the effects of electrical depletion of carriers in the gate conductor.

The fabrication methodology described with respect to FIGS. 1–11 additionally results in a high performance MOS transistor with reduced sub-lithographic channel length and reduced gate line resistance. The method of the invention forms a lower gate conductor portion 56, that is shorter than the minimum lithographic image, and an upper gate portion 60 which may be greater than the minimum lithographic image. Since the effective channel length of the MOSFET is defined by the length of the lower gate portion, and the line resistance is determined by the width of the upper gate portion, both ultra-short channel performance and low gate resistance are satisfied simultaneously. As the new device has a larger area for silicidation, the line resistance is reduced.

The fabrication methodology described with respect to FIGS. 1–11 additionally results in a high performance MOS transistor having improved source/drain extension characteristics, namely a close proximity of source/drain regions to the transistor channel. That is, the process of the invention permits for the independent formation of LDD and/or halo regions and heavily doped and silicided source/drain regions the gate implants.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. Method for fabricating a high performance MOSFET device having a novel gate structure comprising the steps of:
   a) providing a structure of at least one pad layers to function as a mandrel over a semiconductor substrate, said one or more pad layers having an aperture;
   b) depositing a high density plasma dielectric material within said aperture;
   c) forming respective spacer elements on either sidewall of said aperture overlying said high density plasma dielectric material in said aperture;
   d) removing a portion of said high density plasma dielectric material not underlying said spacer elements within said aperture, forming high density plasma dielectric placeholders defining a region of sub-lithographic width;
   e) forming a gate dielectric in said region, wherein said gate dielectric is positioned between said high density plasma dielectric placeholders;
   f) forming a first gate conductor material in said region to form a sub-lithographic lower gate conducting portion within said aperture;
   g) depositing a second gate conductor material to form an upper gate conducting portion within said aperture having a dimension that is wider than said sub-lithographic lower gate conducting portion, and self-aligned to said sub-lithographic lower gate conductor portion;
   wherein a resulting MOSFET device includes a sub-lithographic channel length according to said sub-lithographic lower gate conducting portion.

2. The method according to claim 1, further comprising the step of doping said lower gate conducting portion for minimizing gate depletion effects during MOSFET device operation.

3. The method according to claim 2, further performing, after the step of forming said second gate conductor material atop said lower gate conducting portion, the steps of recessing a top portion of said upper gate conducting portion and depositing a dielectric cap layer atop said upper gate conducting portion.

4. The method according to claim 1, further comprising forming an insulating second spacer along each sidewall of said high density plasma dielectric placeholders, prior to depositing said gate dielectric, wherein said insulating second spacer protects said gate dielectric.

5. The method according to claim 1, wherein said at least one pad layers include an oxide pad layer formed atop said substrate and a nitride pad layer formed atop said oxide pad layer.

6. The method according to claim 1, wherein said step f) comprises depositing said first gate conductor material in said aperture and recessing said first gate conductor material in said aperture to a level below said high density plasma dielectric placeholders.

7. The method according to claim 1, wherein said step g) comprises the steps of depositing said second gate conductor material atop said lower gate conducting portion to the surface of said at least one pad layers and planarizing the surface.

8. The method according to claim 1, wherein said first gate conductor material comprises polysilicon, SiGe or SiGeC.

9. The method according to claim 1, wherein said second gate conductor material comprises polysilicon, SiGe, SiGeC, metals, metal nitrides, metal silicides, refractory metals, refractory metals or silicides or nitrides thereof.

10. The method according to claim 1, further including the steps of:
    h) removing said at least one pad layers to expose said upper and lower gate conducting portions of said gate structure;
    i) providing source and drain implants in said substrate at respective source and drain regions adjacent said gate structure; and
    j) forming sidewall spacers surrounding said gate structure and extending to said source and drain regions.

11. The method according to claim 10, further including the step of doping said source and drain regions to facilitate later formation of a contact.

12. The method according to claim 1, wherein said upper gate conducting portion is of a width longer than a minimum lithographic image.

13. A high performance MOSFET device comprising:
    a substrate;
    a gate dielectric layer of defined sub-lithographic width, defining a sub-lithographic channel;
    a lower gate conducting portion formed on said gate dielectric layer, where said lower gate conducting portion includes a set of notches to reduce the width of said lower gate conducting portion;
    an upper gate conducting portion self-aligned to and wider than said lower gate conducting portion; and
    a source and drain diffusion region formed on either side of said sub-lithographic channel.

14. The high performance MOSFET device of claim 13, wherein said lower gate conducting portion is doped to minimize effects of electrical depletion of carriers during MOSFET device operations.

15. The high performance MOSFET device of claim 13, wherein said upper gate conducting portion comprising polysilicon, SiGe, SiGeC, metal, silicide, metallic nitride, or other conductive materials.

16. The high performance MOSFET device of claim 13, wherein said upper gate conducting portion is capped with an insulator.

17. The high performance MOSFET device of claim 13, wherein said lower gate conducting portion has a width that is less than a lithographic minimum image.

18. The high performance MOSFET device of claim 13, wherein said lower gate conducting portion is flanked by a set of spacers which protect said lower gate conducting portion during etch process steps.

* * * * *